(12) United States Patent
Yudovin-Farber et al.

(10) Patent No.: US 11,191,167 B2
(45) Date of Patent: Nov. 30, 2021

(54) METHOD AND SYSTEM FOR IN SITU SINTERING OF CONDUCTIVE INK

(71) Applicant: Stratasys Ltd., Rehovot (IL)

(72) Inventors: Ira Yudovin-Farber, Rehovot (IL); Efraim Dvash, Rehovot (IL); Tal Ely, Ramat-Gan (IL)

(73) Assignee: Stratasys Ltd., Rehovot (IL)

(*) Notice: Subject to any disclaimer, the term of this patent is extended or adjusted under 35 U.S.C. 154(b) by 99 days.

(21) Appl. No.: 15/557,814

(22) PCT Filed: Mar. 24, 2016

(86) PCT No.: PCT/IL2016/050314
§ 371 (c)(1),
(2) Date: Sep. 13, 2017

(87) PCT Pub. No.: WO2016/151586
PCT Pub. Date: Sep. 29, 2016

(65) Prior Publication Data
US 2018/0295728 A1 Oct. 11, 2018

Related U.S. Application Data

(60) Provisional application No. 62/138,113, filed on Mar. 25, 2015.

(51) Int. Cl.
*H05K 3/12* (2006.01)
*B33Y 10/00* (2015.01)
(Continued)

(52) U.S. Cl.
CPC .......... *H05K 3/1291* (2013.01); *B29C 64/112* (2017.08); *B33Y 10/00* (2014.12); *B33Y 70/00* (2014.12); *B33Y 80/00* (2014.12); *H05K 3/125* (2013.01); *H05K 3/1283* (2013.01); *H05K 3/4664* (2013.01); *B29K 2995/0005* (2013.01); *B29L 2031/3406* (2013.01); *H05K 1/185* (2013.01); *H05K 2203/013* (2013.01); *H05K 2203/1131* (2013.01)

(58) Field of Classification Search
CPC .... H05K 3/1291; H05K 3/125; H05K 3/4664; H05K 3/1283; H05K 2203/013;
(Continued)

(56) References Cited

U.S. PATENT DOCUMENTS 3,986,546 A * 10/1976 Green .................. C09J 4/00
164/525
4,196,033 A * 4/1980 Arai .................... D06N 3/0097
156/196

(Continued)

FOREIGN PATENT DOCUMENTS

CN  1719966  1/2006
CN  102084435  6/2011
(Continued)

OTHER PUBLICATIONS

STN Next Search (Year: 2019).*
(Continued)

*Primary Examiner* — Francisco W Tschen
*Assistant Examiner* — Guy F Mongelli

(57) ABSTRACT

A method of manufacturing a conductive element is disclosed. The method being executed by an additive manufacturing system and comprises: dispensing a modeling material on a receiving medium to form a layer, and dispensing a conductive ink on the layer of modeling material to form a conductive element. In some embodiments of the invention the modeling material comprises a sintering inducing agent, and in some embodiments of the present invention a sintering inducing composition is dispensed separately from the modeling material and separately from the conductive ink.

12 Claims, 6 Drawing Sheets

(51) Int. Cl.
  *B33Y 70/00* (2020.01)
  *B29C 64/112* (2017.01)
  *H05K 3/46* (2006.01)
  *B33Y 80/00* (2015.01)
  *H05K 1/18* (2006.01)
  *B29L 31/34* (2006.01)

(58) Field of Classification Search
  CPC ........... H05K 2203/1131; H05K 1/185; B33Y 80/00; B33Y 70/00; B33Y 10/00; B29C 64/112; B29L 2031/3406; B29K 2995/0005
  See application file for complete search history.

(56) References Cited

U.S. PATENT DOCUMENTS

| | | | |
|---|---|---|---|
| 4,542,165 A * | 9/1985 | Kumata | C08G 18/63 264/328.2 |
| 5,602,191 A * | 2/1997 | Reich | C07C 67/26 522/174 |
| 6,259,962 B1 | 7/2001 | Gothait | |
| 6,441,354 B1 * | 8/2002 | Seghatol | A61C 5/00 219/679 |
| 6,569,373 B2 | 5/2003 | Napadensky | |
| 6,658,314 B1 | 12/2003 | Gothait | |
| 6,850,334 B1 | 2/2005 | Gothait | |
| 7,183,335 B2 | 2/2007 | Napadensky | |
| 7,209,797 B2 | 4/2007 | Kritchman et al. | |
| 7,225,045 B2 | 5/2007 | Gothait et al. | |
| 7,300,619 B2 | 11/2007 | Napadensky et al. | |
| 7,500,846 B2 | 3/2009 | Eshed et al. | |
| 7,676,913 B2 | 3/2010 | Imai et al. | |
| 8,008,364 B2 * | 8/2011 | Shimada | C09B 67/0033 522/75 |
| 8,534,787 B2 | 9/2013 | Yafe | |
| 2001/0025003 A1 * | 9/2001 | Sakai | C04B 35/584 501/152 |
| 2003/0099708 A1 * | 5/2003 | Rowe | A61J 3/10 424/469 |
| 2004/0135269 A1 | 7/2004 | Otsuki | |
| 2004/0167007 A1 * | 8/2004 | Bedard | C04B 35/195 501/32 |
| 2005/0104241 A1 | 5/2005 | Kritchman et al. | |
| 2006/0005994 A1 * | 1/2006 | Imai | H05K 3/4664 174/250 |
| 2006/0013970 A1 | 1/2006 | Wada | |
| 2006/0054039 A1 | 3/2006 | Kritchman et al. | |
| 2006/0068573 A1 | 3/2006 | Shintate et al. | |
| 2007/0165076 A1 * | 7/2007 | Imken | B41J 2/14024 347/58 |
| 2008/0281019 A1 * | 11/2008 | Giller | B33Y 70/00 524/8 |
| 2009/0107546 A1 * | 4/2009 | Allison | H05K 1/095 136/256 |
| 2009/0110889 A1 * | 4/2009 | Toyoda | C09D 11/30 428/206 |
| 2009/0114432 A1 * | 5/2009 | Tsurumi | H05K 3/185 174/258 |
| 2009/0212035 A1 * | 8/2009 | Herrmann | F23Q 7/001 219/270 |
| 2010/0000762 A1 * | 1/2010 | Yang | H05K 3/1283 174/126.1 |
| 2010/0001435 A1 * | 1/2010 | Manley | B29C 67/246 264/328.1 |
| 2010/0130629 A1 * | 5/2010 | Kometani | C08G 18/2063 521/128 |
| 2010/0191360 A1 | 7/2010 | Napadensky et al. | |
| 2011/0212382 A1 * | 9/2011 | Randall | C04B 35/6262 429/494 |
| 2011/0267673 A1 * | 11/2011 | Agrawal | G02F 1/155 359/267 |
| 2012/0168684 A1 * | 7/2012 | Magdassi | B82Y 30/00 252/500 |
| 2013/0186672 A1 * | 7/2013 | Kariya | C09D 11/101 174/133 R |
| 2013/0208064 A1 * | 8/2013 | Ueda | H01B 1/22 428/215 |
| 2013/0256957 A1 * | 10/2013 | Ishigami | B05D 3/067 521/27 |
| 2014/0036455 A1 * | 2/2014 | Napadensky | H05K 1/16 361/748 |
| 2014/0242362 A1 * | 8/2014 | Nakako | H01B 1/22 428/215 |
| 2014/0314966 A1 * | 10/2014 | Fink | H01B 1/026 427/559 |
| 2015/0056382 A1 * | 2/2015 | Suganuma | H01B 1/22 427/553 |
| 2015/0104562 A1 | 4/2015 | Subbaraman et al. | |
| 2015/0105481 A1 * | 4/2015 | Hessing | B05D 3/067 521/27 |
| 2015/0196493 A1 * | 7/2015 | Szymczak | A61K 31/137 424/464 |
| 2015/0247055 A1 * | 9/2015 | Takahashi | C09D 4/00 427/511 |
| 2015/0259247 A1 * | 9/2015 | Watanabe | C04B 12/025 264/642 |
| 2015/0366073 A1 * | 12/2015 | Magdassi | C09D 11/101 174/257 |
| 2017/0137327 A1 * | 5/2017 | Capobianco | C04B 35/6264 |
| 2017/0203508 A1 | 7/2017 | Dikovsky et al. | |
| 2018/0311892 A1 * | 11/2018 | Abbott, Jr. | B29C 64/165 |

FOREIGN PATENT DOCUMENTS

| | | | | |
|---|---|---|---|---|
| CN | 102686777 | | 9/2012 | |
| CN | 103154316 | | 6/2013 | |
| EP | 214815 | * | 8/1986 | |
| EP | 0450381 | | 10/1991 | |
| EP | 2001656 | | 12/2008 | |
| JP | 2001-144217 | | 5/2001 | |
| JP | 2003-257769 | | 9/2003 | |
| JP | 2004-055965 | | 2/2004 | |
| JP | 2006-024768 | | 1/2006 | |
| JP | 2006-032535 | | 2/2006 | |
| JP | 2006-121039 | | 5/2006 | |
| JP | 2009-021552 | | 1/2009 | |
| JP | 2011-031591 | | 2/2011 | |
| JP | 2011-054620 | | 3/2011 | |
| JP | 2012-521493 | | 9/2012 | |
| JP | 2014-514193 | | 6/2014 | |
| KR | 10-1998-0041872 | | 8/1998 | |
| TW | I425899 | | 2/2014 | |
| WO | WO 2008/102266 | | 8/2008 | |
| WO | WO 2010/109465 | | 9/2010 | |
| WO | WO-2011073638 A1 | * | 6/2011 | B01J 39/20 |
| WO | WO 2012/143923 | | 10/2012 | |
| WO | WO 2012/168941 | | 12/2012 | |
| WO | WO-2013153360 A1 | * | 10/2013 | B01D 69/10 |
| WO | WO-2014006934 A1 | * | 1/2014 | H01B 13/322 |
| WO | WO 2014/118783 | | 8/2014 | |
| WO | WO-2014185102 A1 | * | 11/2014 | B22F 10/10 |
| WO | WO 2015/145439 | | 10/2015 | |
| WO | WO-2015145439 A1 | * | 10/2015 | C09D 11/52 |
| WO | WO 2016/151586 | | 9/2016 | |

OTHER PUBLICATIONS

JP04296542 WIPO PatentScope Translation (Year: 2021).*
Notice of Reasons for Rejection dated Jan. 29, 2019 from the Japan Patent Office Re. Application No. 2016-558572 and Its Translation Into English. (9 Pages).
Translation Dated Mar. 13, 2019 of Notification of Office Action dated Feb. 3, 2019 From the State Intellectual Property Office of China Re. Application No. 201680029611.6. (6 Pages).
Communication Pursuant to Article 94(3) EPC dated Sep. 10, 2018 From the European Patent Office Re. Application No. 15768896.1. (5 Pages).
Notification of Office Action and Search Report dated Jul. 27, 2018 From the State Intellectual Property Office of the People's Republic

(56) References Cited

OTHER PUBLICATIONS of China Re. Application No. 201580026748.1 and Its Summary in English. (11 Pages).
Notification of Office Action dated May 30, 2019 From the State Intellectual Property Office of the People's Republic of China Re. Application No. 201580026748.1 and Its Translation Into English. (16 Pages).
Translation Dated Sep. 3, 2018 of Notification of Office Action dated Jul. 27, 2018 From the State Intellectual Property Office of the People's Republic of China Re. Application No. 201580026748.1. (9 Pages).
International Preliminary Report on Patentability dated Oct. 5, 2017 From the International Bureau of WIPO Re. Application No. PCT/IL2016/050314. (9 Pages).
International Preliminary Report on Patentability dated Oct. 6, 2016 From the International Bureau of WIPO Re. Application No. PCT/IL2015/050316.
International Search Report and the Written Opinion dated Jul. 3, 2016 From the International Searching Authority Re. Application No. PCT/IL2016/050314.
International Search Report and the Written Opinion dated Jun. 21, 2015 From the International Searching Authority Re. Application No. PCT/IL2015/050316.
Supplementary European Search Report and the European Search Opinion dated Nov. 7, 2017 From the European Patent Office Re. Application No. 15768896.1. (7 Pages).
Supplementary European Search Report and the European Search Opinion dated Nov. 28, 2018 From the European Patent Office Re. Application No. 16767878.8. (10 Pages).
Grouchko et al. "Conductive Inks With A 'Built-In' Mechanism That Enables Sintering at Room Temperature", ACS Nano, XP002684747, 5(4): 3354-3359, Published Online Mar. 25, 2011. p. 3345.
Official Action dated Jan. 11, 2019 From the US Patent and Trademark Office Re. U.S. Appl. No. 15/128,975. (26 pages).
Official Action dated Aug. 8, 2019 From the US Patent and Tradekmark Office Re. U.S. Appl. No. 15/128,975. (20 pages).
Notification of Office Action and Search Report dated Aug. 20, 2019 From the State Intellectual Property Office of the People's Republic of China Re. Application No. 201680029611.6. (9 Pages).
Translation Dated Aug. 29, 2019 of Notification of Office Action dated Aug. 20, 2019 From the State Intellectual Property Office of the People's Republic of China Re. Application No. 201680029611.6. (5 Pages).
Office Action dated Sep. 24, 2020 From the Israel Patent Office Re. Application No. 248023 and Its Translation Into English. (11 Pages).
Office Action dated Jan. 21, 2021 From the Israel Patent Office Re. Application No. 254610 and Its Translation Into English. (6 Pages).
Notice of Preliminary Rejection dated Apr. 20, 2020 From the Korean Intellectual Property Office Re. Application No. 10-2016-7029174 and Its Translation Into English. (11 Pages).
Notice of Reasons for Rejection dated Mar. 3, 2020 From the Japan Patent Office Re. Application No. 2017-549387 and Its Translation Into English.
Notification of Office Action and Search Report dated Apr. 22, 2020 From the State Intellectual Property Office of the People's Republic of China Re. Application No. 201680029611.6. (11 Pages).
Official Action dated May 15, 2020 from the US Patent and Trademark Office Re. U.S. Appl. No. 15/128,975. (21 pages).
Translation Dated May 25, 2020 of Notification of Office Action dated Apr. 22, 2020 From the State Intellectual Property Office of the People's Republic of China Re. Application No. 201680029611.6. (10 Pages).
Notice of Reasons for Rejection dated Sep. 15, 2020 From the Japan Patent Office Re. Application No. 2019-148754. (8 Pages).
Notice of Reason(s) for Rejection dated Dec. 8, 2020 From the Japan Patent Office Re. Application No. 2017-549387 and Its Translation Into English. (5 Pages).
Office Action dated Dec. 31, 2019 From the Israel Patent Office Re. Application No. 248023 and Its Translation Into English. (7 Pages).
Office Action dated Mar. 16, 2021 From the Israel Patent Office Re. Application No. 248023 and Its Translation Into English. (9 Pages).
Decision of Rejection dated May 1, 2021 From the Japan Patent Office Re. Application No. 2019-148754. (1 Page).

\* cited by examiner

METHOD AND SYSTEM FOR IN SITU SINTERING OF CONDUCTIVE INK

RELATED APPLICATIONS

This application is a National Phase of PCT Patent Application No. PCT/IL2016/050314 having International filing date of Mar. 24, 2016, which claims the benefit of priority under 35 USC § 119(e) of U.S. Provisional Patent Application No. 62/138,113 filed on Mar. 25, 2015. The contents of the above applications are all incorporated by reference as if fully set forth herein in their entirety.

FIELD AND BACKGROUND OF THE INVENTION

The present invention, in some embodiments thereof, relates to freeform fabrication and, more particularly, but not exclusively, to a method and system for in situ sintering of conductive ink during freeform fabrication.

Solid Freeform Fabrication (SFF) is a technology enabling fabrication of arbitrarily shaped structures directly from computer data via additive formation steps. The basic operation of any SFF system consists of slicing a three-dimensional computer model into thin cross sections, translating the result into two-dimensional position data and feeding the data to control equipment which fabricates a three-dimensional structure in a layerwise manner.

Additive manufacturing (AM) includes several manufacturing techniques in which material is dispensed layer by layer to form a final product. One AM technique, is known as three dimensional (3D) inkjet printing. In this technique, a building material is dispensed from a dispensing head having a set of nozzles to deposit layers on a supporting structure. Depending on the building material, the layers may then be cured or solidified using a suitable device. The building material may include modeling material, which forms the object, and support material, which supports the object as it is being built.

Various three-dimensional printing techniques exist and are disclosed in, e.g., U.S. Pat. Nos. 6,259,962, 6,569,373, 6,658,314, 6,850,334, 7,183,335 7,209,797, 7,300,619, 7,225,045 and 7,500,846, and U.S. Published Applications Nos. 20050104241 and 20060054039, all of the same Assignee, the contents of which are hereby incorporated by reference.

Deposition and printing methods for printing two dimensional (2D) electrical conductive elements on a flat substrate are also known. For example, U.S. Pat. No. 8,534,787 discloses a printing bridge that accommodates a jet print head that moves above an object. The jet print head includes first jet nozzles for injecting a first type substance onto the surface of the object, and second jet nozzles for injecting a second type of substance onto the surface of the object. The first type substance is utilized for printing a solder mask pattern and the second type substance is utilized for printing a legend pattern.

SUMMARY OF THE INVENTION

According to an aspect of some embodiments of the present invention there is provided a method of manufacturing a conductive element, the method being executed by an additive manufacturing system and comprises: dispensing a modeling material on a receiving medium to form a layer, and dispensing a conductive ink on the layer of modeling material to form a conductive element. In some exemplary embodiments of the invention the modeling material comprises a sintering inducing agent.

According to some embodiments of the invention the conductive ink is non-curable.

According to some embodiments of the invention the conductive ink is curable.

According to some embodiments of the invention the method comprises partially curing the modeling material prior to the dispensing of the conductive ink.

According to some embodiments of the invention the method comprises at least partially drying the conductive ink following the dispensing of the conductive ink.

According to some embodiments of the invention the method comprises dispensing modeling material to form a layer on top of the conductive element, wherein the modeling material dispensed on top of the conductive element also comprises a sintering inducing agent.

According to some embodiments of the invention the modeling material is curable but the sintering inducing agent is non-curable.

According to some embodiments of the invention the conductive ink is non-curable.

According to some embodiments of the invention the conductive ink is curable.

According to an aspect of some embodiments of the present invention there is provided a composition for additive manufacturing of three-dimensional objects. The composition comprises a curable modeling material and a non-curable sintering inducing agent mixed with the curable modeling material.

According to an aspect of some embodiments of the present invention there is provided a composition for additive manufacturing of three-dimensional objects. The composition comprises a curable modeling material and a curable sintering inducing agent mixed with the curable modeling material.

According to an aspect of some embodiments of the present invention there is provided a kit for use in an additive manufacturing system. The kit comprises, in separate packaging, a conductive ink, and the composition for additive manufacturing of three-dimensional, as delineated above and optionally further detailed below.

According to an aspect of some embodiments of the present invention there is provided a method of manufacturing a conductive element. The method being executed by an additive manufacturing system and comprises: dispensing modeling material on a receiving medium to form a layer, dispensing a non-curable or curable conductive ink on the layer of modeling material to form a conductive element, and dispensing sintering inducing composition having a sintering inducing agent on at least one of the layer and the conductive element.

According to an aspect of some embodiments of the present invention there is provided a method of manufacturing a conductive element. The method being executed by an additive manufacturing system and comprises: dispensing a modeling material on a receiving medium to form a layer, dispensing a sintering inducing composition having a sintering inducing agent on the layer, and dispensing a non-curable or curable conductive ink conductive ink on said sintering inducing composition. According to some embodiments of the invention the method comprises dispensing the sintering inducing composition on at least one of the layer and the conductive element.

According to some embodiments of the invention the sintering inducing composition is dispensed at least on the conductive element.

According to some embodiments of the invention the sintering inducing composition comprises a sintering inducing agent which is a compound selected from the group consisting of free radical polymerizable compound, cationic polymerizable compound and anionic polymerizable compound.

According to some embodiments of the invention the sintering inducing agent comprises an ionic group and a counter ion, said ionic group being an acrylic compound.

According to some embodiments of the invention the sintering inducing agent is a salt.

According to some embodiments of the invention the counter ion is an anion and the ionic group is or comprises a cationic group.

According to some embodiments of the invention the counter anion is selected from the group consisting of a halogen anion, a sulfate anion, a perchlorate anion, a chlorate anion, a nitrate anion, a carboxylate anion, a sulfonate anion, a phosphate anion and a phosphonate anion.

According to some embodiments of the invention the counter anion is selected from the group consisting of chloride, sulfate, nitrate, phosphate, carboxylate and p-toluenesulfonate.

According to some embodiments of the invention the counter anion is chloride.

According to some embodiments of the invention the ionic group comprises an acrylate, a methacrylate, an acrylamide, a methacrylamide, an oligomer and/or a polymer.

According to some embodiments of the invention the cationic group is a quaternary ammonium group.

According to some embodiments of the invention the ionic group is selected from the group consisting of poly (diallyldimethylammonium chloride), cationically charged polyimide, polyethyleneimine and polypyrrole.

According to some embodiments of the invention the sintering inducing agent is represented by the general formula:

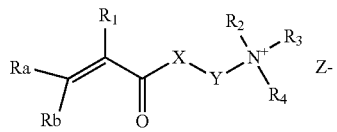

wherein: X is O (in which case the agents is an acrylate derivative) or NH (in which case the agents is an acrylamide derivative), Y is a substituted or unsubstituted hydrocarbon chain from 1 to 20 carbon atoms in length, $R_1$ is H (in which case the salt is an acrylate derivative or an acrylamide derivative) or alkyl, preferably methyl ($CH_3$) (in which case the salt is a methacrylate derivative or methacrylamide derivative) or cycloalkyl, Ra and Rb are each independently selected from hydrogen, alkyl and cycloalkyl, and preferably each of Ra and Rb is hydrogen (H), $R_2$-$R_4$ are each independently an alkyl, optionally $C_{1-4}$ alkyl, and Z is an anion, as described herein.

According to some embodiments of the invention the sintering inducing agent is represented by the general formula:

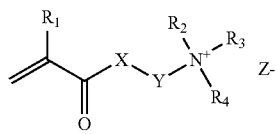

wherein: X is O or NH, Y is a substituted or unsubstituted hydrocarbon chain from 1 to 20 carbon atoms in length, $R_1$ is H (in which case the salt is an acrylate derivative) or alkyl, preferably methyl, $CH_3$ (in which case the salt is a methacrylate derivative) or cycloalkyl, $R_2$-$R_4$ are each independently an alkyl, optionally $C_{1-4}$ alkyl, and Z is an anion.

According to some embodiments of the invention Y is an unsubstituted hydrocarbon chain. According to some embodiments of the invention $R_2$-$R_4$ are each independently methyl or ethyl. According to some embodiments of the invention $R_2$-$R_4$ are each methyl.

According to some embodiments of the invention Y is an unsubstituted hydrocarbon chain.

According to some embodiments of the invention $R_2$-$R_4$ are each independently methyl or ethyl.

According to some embodiments of the invention $R_2$-$R_4$ are each methyl.

According to some embodiments of the invention the Ra and Rb are each hydrogen.

According to some embodiments of the invention the sintering inducing composition further comprises a sintering inert material.

According to some embodiments of the invention the sintering inert material is a curable material.

According to some embodiments of the invention the sintering inducing agent is selected from the group consisting of an ammonium-substituted acrylate, trimethyl ammonium methyl methacrylate chloride, 3-trimethyl ammonium propyl methacrylamide chloride, and an ammonium-substituted acrylamide.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
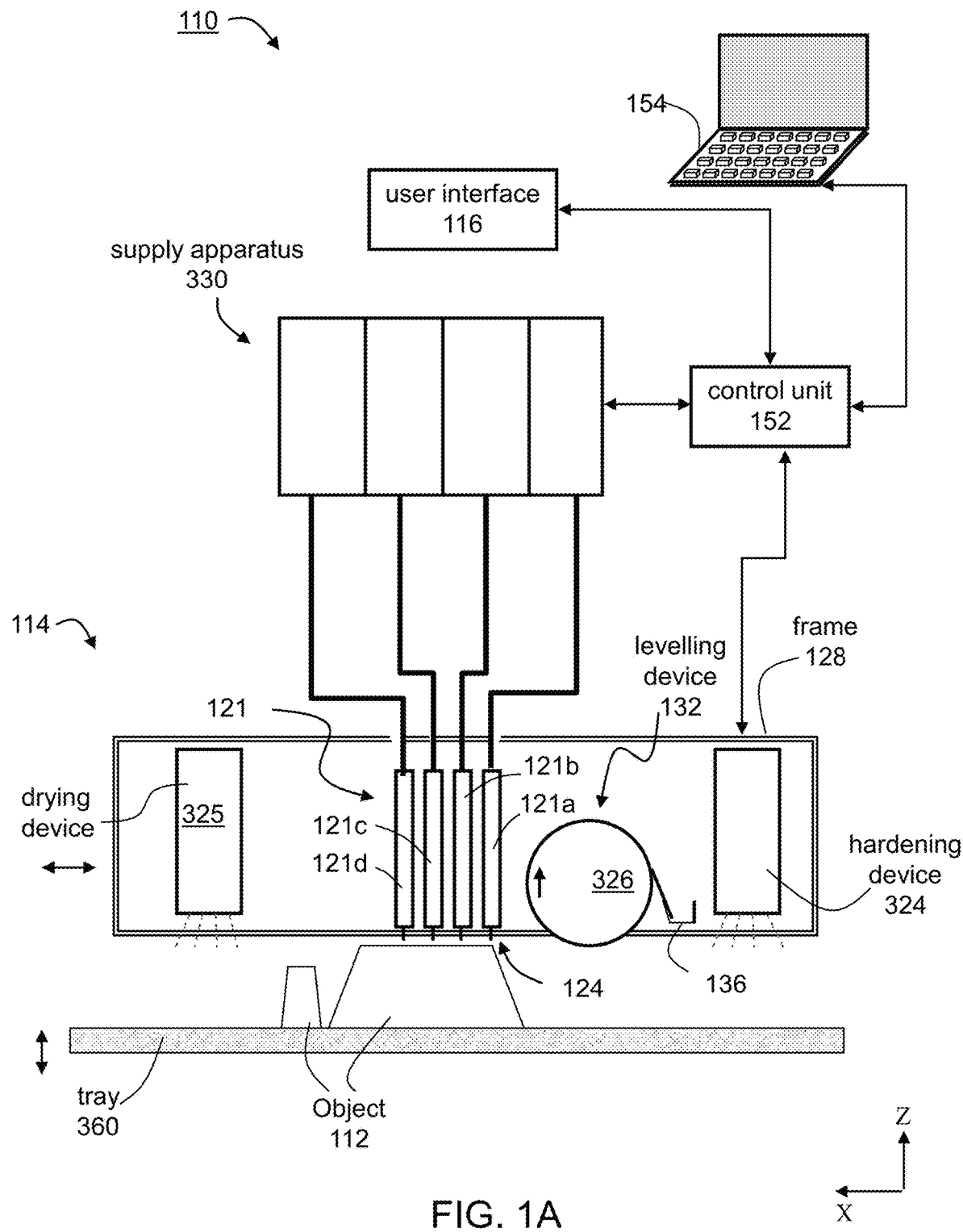
FIGS. 1A and 1B are high level schematic block diagrams of an additive manufacturing system according to some embodiments of the invention.

The present invention, in some embodiments thereof, relates to freeform fabrication and, more particularly, but not exclusively, to a method and system for in situ sintering of conductive ink during freeform fabrication.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The method and system of the present embodiments manufacture three-dimensional objects based on computer object data in a layerwise manner by forming a plurality of layers in a configured pattern corresponding to the shape of the objects. The computer object data can be in any known format, including, without limitation, a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

The term "object" as used herein refers to a whole object or a part thereof.

Each layer is formed by additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material, and which type of building material is to be delivered thereto. The decision is made according to a computer image of the surface.

In preferred embodiments of the present invention the AM comprises three-dimensional printing, more preferably three-dimensional inkjet printing. In these embodiments a building material is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials. The types of building materials can be categorized into two major categories: modeling material and support material. The support material serves as a supporting matrix or construction for supporting the object or object parts during the fabrication process and/or other purposes, e.g., providing hollow or porous objects. Support constructions may additionally include modeling material elements, e.g. for further support strength.

The modeling material is generally a composition which is formulated for use in additive manufacturing and which is able to form a three-dimensional object on its own, i.e., without having to be mixed or combined with any other substance.

The final three-dimensional object is made of the modeling material or a combination of modeling materials or modeling and support materials or modification thereof (e.g., following curing). All these operations are well-known to those skilled in the art of solid freeform fabrication.

In some exemplary embodiments of the invention an object is manufactured by dispensing two or more different modeling materials, each material from a different dispensing head of the AM. The materials are optionally and preferably deposited in layers during the same pass of the printing heads. The materials and combination of materials within the layer are selected according to the desired properties of the object.

Figure 1B:
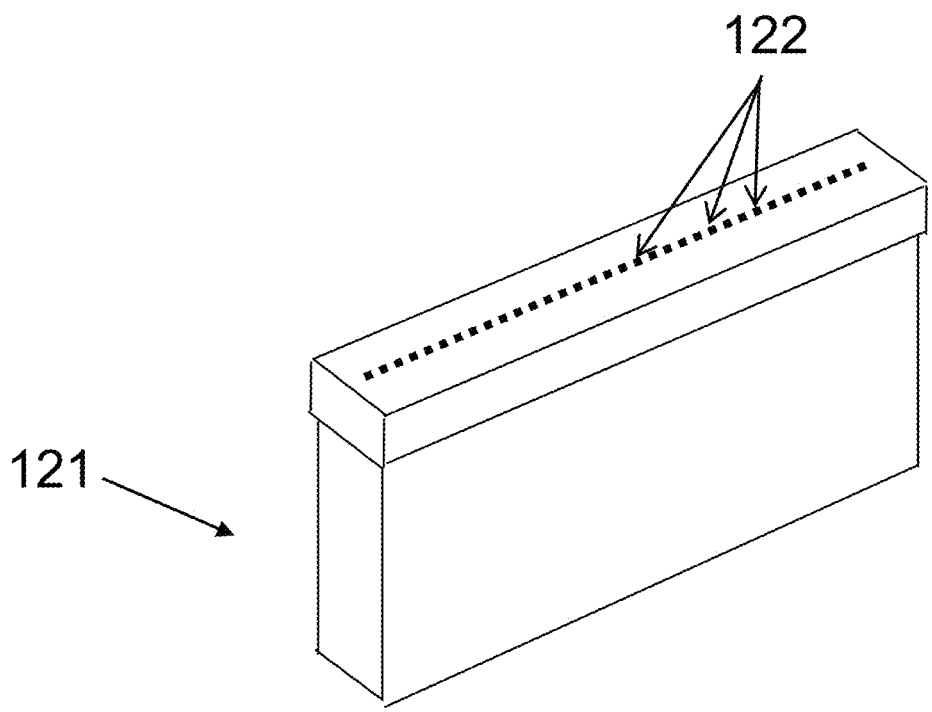

A representative and non-limiting example of a system 110 suitable for AM of an object 112 according to some embodiments of the present invention is illustrated in FIGS. 1A-B. System 110 comprises an additive manufacturing apparatus 114 having a dispensing unit 121 which comprises a plurality of dispensing heads. Each head preferably comprises an array of one or more nozzles 122, as illustrated in FIG. 1B, through which a liquid building material 124 is dispensed.

Preferably, but not obligatorily, apparatus 114 is a three-dimensional printing apparatus, in which case the dispensing heads are printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, binder jet powder based apparatus, fused deposition modeling apparatus and fused material deposition apparatus.

Each dispensing head is optionally and preferably fed via a building material reservoir which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Preferably, but not obligatorily, the overall number of dispensing nozzles or nozzle arrays is selected such that half of the dispensing nozzles are designated to dispense support material and half of the dispensing nozzles are designated to dispense modeling material, i.e. the number of nozzles jetting modeling materials is the same as the number of nozzles jetting support material. In the representative example of FIG. 1A, four dispensing heads 121a, 121b, 121c and 121d are illustrated. Each of heads 121a, 121b, 121c and 121d has a nozzle array. In this Example, heads 121a and 121b can be designated for modeling material/s and heads 121c and 121d can be designated for support material. Thus, head 121a can dispense a first modeling material, head 121b can dispense a second modeling material and heads 121c and 121d can both dispense support material. In an alternative embodiment, heads 121c and 121d, for example, may be combined in a single head having two nozzle arrays for depositing support material.

Yet it is to be understood that it is not intended to limit the scope of the present invention and that the number of modeling material depositing heads (modeling heads) and the number of support material depositing heads (support heads) may differ. Generally, the number of modeling heads, the number of support heads and the number of nozzles in each respective head or head array are selected such as to provide a predetermined ratio, a, between the maximal dispensing rate of the support material and the maximal dispensing rate of modeling material. The value of the predetermined ratio, a, is preferably selected to ensure that in each formed layer, the height of modeling material equals the height of support material. Typical values for a are from about 0.6 to about 1.5.

As used herein the term "about" refers to ±10%.

For example, for a=1, the overall dispensing rate of support material is generally the same as the overall dispensing rate of the modeling material when all modeling heads and support heads operate.

In a preferred embodiment, there are M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material level sensor of its own, and receives an individually controlled voltage for its operation.

Apparatus 114 can further comprise a hardening device 324 which can include any device configured to emit light, heat or the like that may cause the deposited material to hardened. For example, hardening device 324 can comprise one or more radiation sources, which can be, for example, an ultraviolet or visible or infrared lamp, or other sources of electromagnetic radiation, or electron beam source, depending on the modeling material being used. In some embodiments of the present invention, hardening device 324 serves for curing or solidifying the modeling material.

The dispensing head and radiation source are preferably mounted in a frame or block 128 which is preferably operative to reciprocally move over a tray 360, which serves as the working surface. In some embodiments of the present invention the radiation sources are mounted in the block such that they follow in the wake of the dispensing heads to at least partially cure or solidify the materials just dispensed by the dispensing heads. Tray 360 is positioned horizontally. According to the common conventions an X-Y-Z Cartesian coordinate system is selected such that the X-Y plane is parallel to tray 360. Tray 360 is preferably configured to move vertically (along the Z direction), typically downward. In various exemplary embodiments of the invention, apparatus 114 further comprises one or more leveling devices 132, e.g. a roller 326. Leveling device 326 serves to straighten, level and/or establish a thickness of the newly formed layer prior to the formation of the successive layer thereon. Leveling device 326 preferably comprises a waste collection device 136 for collecting the excess material generated during leveling. Waste collection device 136 may comprise any mechanism that delivers the material to a waste tank or waste cartridge.

In use, the dispensing heads of unit 121 move in a scanning direction, which is referred to herein as the X direction, and selectively dispense building material in a predetermined configuration in the course of their passage over tray 360. The building material typically comprises one or more types of support material and one or more types of modeling material. The passage of the dispensing heads of unit 121 is followed by the curing of the modeling material(s) by radiation source 126. In the reverse passage of the heads, back to their starting point for the layer just deposited, an additional dispensing of building material may be carried out, according to predetermined configuration. In the forward and/or reverse passages of the dispensing heads, the layer thus formed may be straightened by leveling device 326, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternately, the dispensing heads may move in the Y direction between forward and reverse movements or after more than one forward-reverse movement. The series of scans performed by the dispensing heads to complete a single layer is referred to herein as a single scan cycle.

Once the layer is completed, tray 360 is lowered in the Z direction to a predetermined Z level, according to the desired thickness of the layer subsequently to be printed. The procedure is repeated to form three-dimensional object 112 in a layerwise manner.

In another embodiment, tray 360 may be displaced in the Z direction between forward and reverse passages of the dispensing head of unit 121, within the layer. Such Z displacement is carried out in order to cause contact of the leveling device with the surface in one direction and prevent contact in the other direction.

System 110 optionally and preferably comprises a building material supply system 330 which comprises the building material containers or cartridges and supplies a plurality of building materials to fabrication apparatus 114.

A control unit 340 controls fabrication apparatus 114 and optionally and preferably also supply system 330. Control unit 340 typically includes an electronic circuit configured to perform the controlling operations. Control unit 340 preferably communicates with a data processor 154 which transmits digital data pertaining to fabrication instructions based on computer object data, e.g., a CAD configuration represented on a computer readable medium in a form of a Standard Tessellation Language (STL) format or the like. Typically, control unit 340 controls the voltage applied to each dispensing head or nozzle array and the temperature of the building material in the respective printing head.

Processor 154 can include, for example, a central processing unit processor (CPU), a chip or any suitable computing or computational device, a memory and storage unit. The memory may include for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. The memory may include a plurality of possibly different memory units.

The memory may include an executable code, e.g., an application, a program, a process, task or script. The executable codes may include codes or instructions for controlling system 110 to fabricate 3D objects according to embodiments described herein. For example, the memory may include a code for creating a layer, using for example, dispensing heads that dispense building material and hardening the building material. The code may further include dispensing a conductive ink to form a conductive element on the layer.

Once the manufacturing data is loaded to control unit 340 it can operate without user intervention. In some embodiments, control unit 340 receives additional input from the operator, e.g., using data processor 154 or using a user interface 116 communicating with unit 340. User interface 116 can be of any type known in the art, such as, but not limited to, a keyboard, a touch screen and the like. For example, control unit 340 can receive, as additional input, one or more building material types and/or attributes, such as, but not limited to, color, characteristic distortion and/or transition temperature, viscosity, electrical property, magnetic property. Other attributes and groups of attributes are also contemplated.

It will be recognized that any suitable number of input devices may be included in user interface 116. User interface 116 may further include output devices such as: one or more displays, speakers and/or any other suitable output devices. It will be recognized that any suitable number of output devices may be included in user interface 116. Any applicable input/output (I/O) devices may be connected to controller 340. For example, a wired or wireless network interface card (NIC), a modem, printer or facsimile machine, a universal serial bus (USB) device or external hard drive may be included in user interface 116.

Some embodiments contemplate the fabrication of an object by dispensing different materials from different dispensing heads. These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

The present embodiments thus enable the deposition of a broad range of material combinations, and the fabrication of an object which may consist of multiple different combinations of materials, in different parts of the object, according to the properties desired to characterize each part of the object.

Further details on the principles and operations of an AM system such as system 110 are found in U.S. Published Application No. 20100191360, the contents of which are hereby incorporated by reference.

In some embodiments of the present invention the AM system is operated to selectively dispense a modeling material and a conductive ink to form a conductive element on a layer of modeling material. The AM system is optionally and preferably operated to form a layered 3D object that includes an electrically conductive pattern, formed during deposition of the layers. The present embodiments can be used for forming segments of patterning material (e.g., electrically conductive segments) along any direction, including a horizontal direction (in-plane or parallel to the horizontal plane), a tilted direction relative to the horizontal plane, and the vertical direction (perpendicular to the horizontal direction).

In some embodiments, electrical or electronic components such as a microchip, a battery, a lamp or a PCB can be inserted inside the 3D object during the deposition process while creating an electrical connection to the electrical device or electronic component by selectively depositing electrically conductive material forming electrical contacts during the deposition of the building material.

In some embodiments, the conductive material is dispensed intermittently to form a plurality of interconnected conductive elements. The thickness of each conductive element is preferably different from the thickness of the deposited layers of building material. Typically, the thickness of a conductive element is at least 3 times or at least 5 times or at least 10 times or at least 50 times less than a thickness of a modeling material layer onto which or below which the pattern element is dispensed. For example, the layers of building (modeling or support) material may have a thickness of 5-1000 μm, more preferably 10-100 μm, whereas the conductive elements may have a thickness of 0.1-100 μm, more preferably 0.1-10 μm, more preferably 0.1-5 μm, more preferably 0.1-3 μm.

The conductive ink preferably comprises conductive particles, optionally and preferably conductive (e.g., metallic) microparticles or nanoparticles dispersed in a liquid solvent. In some embodiments of the present invention the liquid solvent is non-curable, and in some embodiments of the present invention the liquid solvent is curable. When the solvent evaporates the thickness of the region that this ink occupies is reduced, for example, to the aforementioned thickness ranges. The conductive ink optionally and preferably comprises formulation aides such as dispersion stabilizers, emulsifiers, wetting and rheological additives, and the like.

The particles employed in accordance with some embodiments of the present invention are solid particles having at least one dimension in the nanometer scale, e.g., an average size of from about 0.1 to about 900 nm, or from about 0.1 to about 500 nm, from about 0.1 to about 100 nm, from about 0.1 to about 10 nm, or from 0.1 to about 5 nm, or from about 1 to about 10 nm, or from about 10 to about 30 nm, or from about 10 to about 100 nm. In some embodiments of the present invention the particles have a particle size of from about 1 to about 100 micros.

The particles may be of any shape or form including, but not limited to, rods (e.g., nanorods), spherical particles, wires (e.g., nanowires), sheets (e.g., nanosheets), quantum dots, and core-shell particles, and the like. When the particles are generally spherical, the particle size refers to the diameter of the spheres. When the particles are not in the form of a sphere, the particle size refers to the particle's largest dimension.

The particles can be composed of a metal selected from metals of Groups IIIB, IVB, VB, VIB, VIIB, VIIIB, IB or IIB of block d of the Periodic Table of Elements. In some embodiments, the particles comprise one or more elements selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Al, Sn, In, Ga and Ir. In some embodiments the particles comprise one or more elements selected from Cu, Ni, Ag, Au, Pt, Pd, Al, Fe, Co, Ti, Zn, In, Sn and Ga. In some embodiments the particles comprise one or more elements selected from Cu, Ni and Ag. In some embodiments the particles comprise one or more elements selected from Ag and Cu. In some embodiments the particles comprise Ag.

In various preferred embodiments of the invention the post dispensing processes for the building material is different from the post dispensing processes for the conductive ink. For example, the building (modeling, support) material is typically hardened or cured after it is dispensed as further detailed hereinabove. The conductive ink is optionally and preferably dried to evaporate the solvent. The drying may result in a reduced electrical conductivity, due to the presence of various components in the conductive ink, which components form insulating layers between the particles. In these cases, the conductive ink is preferably also sintered to consolidate the conductive particles therein.

In various exemplary embodiments of the invention chemical sintering is employed. One advantage of chemical sintering is that it does not require use of a sintering device in the dispensing block. Another advantage of chemical sintering is that it reduces the amount of unnecessary radiation to which the building material is exposed, and which can result in shape deformation of the building material layers.

Chemical sintering is optionally and preferably achieved by contacting the dispensed conductive element with a substance selected to induce sintering. The substance can optionally and preferably include a compound selected from the group consisting of free radical polymerizable compound, cationic polymerizable compound and anionic polymerizable compound, as described in further detail hereinafter.

The substance can be provided as a separate composition dispensed from a separate dispensing head of the AM system. Alternatively or additionally, the substance can be provided as a sintering agent contained (e.g., mixed) in the non-conductive material.

When a sintering inducing agent is contained in the non-conductive material, the conductive ink is optionally and preferably dispensed on the modeling material layer before the completion of the curing of the modeling material, so as to allow the particles in the conductive ink to contact the sintering inducing agent in the modeling material. Alternatively, or more preferably additionally, the non-conductive material containing the sintering inducing agent can be applied on the conductive element. This can be done after the conductive ink is dried, after the conductive ink is partially dried (e.g., after about 10%-90% solvent was evaporated from the conductive ink), or immediately after the conductive ink is dispensed and before drying.

Preferably, the sintering inducing agent in the non-conductive modeling material is non-curable. It was found by the present inventors that incorporation of non-curable components with a curable modeling material are advantageous since they facilitate better chemical sintering by allowing the non-curable agent to react with the conductive ink.

The present embodiments contemplate both sintering inducing agents that are UV reactive (e.g., UV curable) and sintering inducing agents that are non UV reactive (non-UV curable).

In various exemplary embodiments of the invention the sintering inducing composition or agent comprises an ionic moiety. This allows reduction of electrostatic stabilization of the conductive particles in the ink by charge exchange reaction. Preferably the sintering inducing composition or agent comprises an ionic group which is optionally and preferably an acrylic monomer or derivative, and a counter ion, wherein the ionic group serves as a carrier and the counter ion serves for decoupling or suppressing coupling of dispersant molecules to the conductive particles thereby allowing them to consolidate.

In various exemplary embodiments of the invention the counter ion is anionic and the ionic group is cationic, namely, the ionic group is or comprises a cationic group. The sintering inducing agents may optionally and preferably be selected amongst salts.

The counter anion may be, for example, a halogen anion ($F^-$, $Cl^-$, $Br^-$ and/or $I^-$), a sulfate anion ($SO_4^{2-}$ and/or $RSO_4^-$, wherein R is hydrogen, alkyl, cycloalkyl or aryl, preferably hydrogen), a perchlorate anion ($ClO_4^-$), a chlorate anion ($ClO_3^-$), a nitrate anion ($NO_3^-$), a carboxylate anion (e.g., $RCO_2^-$, wherein R is alkyl, cycloalkyl or aryl, preferably alkyl); a sulfonate anion (e.g., $SO_3^{2-}$ or $RSO_3^-$, wherein R is hydrogen, alkyl, cycloalkyl or aryl, preferably an alkyl that provides an alkanesulfonate such as methanesulfonate anion, or an aryl that provides, e.g., a p-toluenesulfonate anion); a phosphate anion ($P(=O)-O_3^{3-}$ and/or $P(=O)(OR)O_2^{2-}$ and/or $P(=O)(OR)_2O^-$, wherein R is hydrogen, alkyl, cycloalkyl or aryl); and a phosphonate anion (($R'P(=O)-O_2^{2-}$ and/or $R'P(=O)(OR)O^-$, wherein R is hydrogen, alkyl, cycloalkyl or aryl). In some embodiments of the present invention the counter anion is selected from the group consisting of chloride, sulfate, nitrate, phosphate, carboxylate (e.g., acetate) and halogen. In some embodiments, the counter anion is chloride. Any other anions are also contemplated.

The present embodiments contemplate various acrylates, methacrylates, acrylamides, methacrylamides, and oligomers and polymers thereof, collectively referred to herein as acrylic or (meth)acrylic compounds, which contain one or more charged groups, preferably positively charged groups (cationic groups). Representative examples of cationic groups suitable for the present embodiments include, without limitation, a quaternary ammonium group.

In some embodiments, the salt comprising an anion (e.g., as described herein) and a cationic acrylic compound is represented by the general formula:

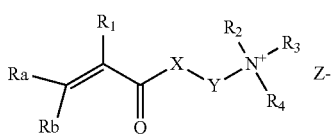

wherein: X is O (in which case the agents is an acrylate derivative) or NH (in which case the agents is an acrylamide derivative), Y is a substituted or unsubstituted hydrocarbon chain from 1 to 20 carbon atoms in length, $R_1$ is H (in which case the salt is an acrylate derivative or an acrylamide derivative) or alkyl, preferably methyl $CH_3$ (in which case the salt is a methacrylate derivative or a methacrylamide derivative) or cycloalkyl, Ra and Rb are each independently selected from hydrogen, alkyl and cycloalkyl, and preferably each of Ra and Rb is hydrogen (H), $R_2$-$R_4$ are each independently an alkyl, optionally $C_{1-4}$ alkyl, and Z is an anion. In some embodiments, the salt comprising an anion (e.g., as described herein) and a cationic acrylic compound is represented by the general formula:

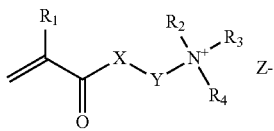

wherein:

X is O or NH, as described herein;

Y is a substituted or unsubstituted hydrocarbon chain from 1 to 20 carbon atoms in length;

$R_1$ is H or alkyl, preferably $CH_3$, as described herein;

$R_2$-$R_4$ are each independently an alkyl; and

Z is an anion described herein.

In some embodiments, Y is an unsubstituted hydrocarbon chain (alkylene).

In some embodiments, Y is from 1 to 10 carbon atoms in length. In some embodiments, Y is from 1 to 4 carbon atoms in length. In some embodiments, Y is 2 or 3 carbon atoms in length (e.g., —$CH_2CH_2$— or —$CH_2CH_2CH_2$—).

In some embodiments, $R_1$ is $CH_3$.

In some embodiments, $R_2$-$R_4$ are each independently methyl or ethyl. In some embodiments $R_2$-$R_4$ are each methyl.

Representative examples of acrylic compounds that can be used as a sintering inducing agent, include, without limitation, an ammonium-substituted acrylate (e.g., Adamquat MQ 80), trimethyl ammonium methyl methacrylate chloride (e.g., Visiomer TMAEMC), 3-trimethyl ammonium propyl methacrylamide chloride (e.g., Visiomer MAPTAC 30), and an ammonium-substituted acrylamide (e.g., DMAPAAQ, for example, Rahn, RCX-14/705).

Substances that can be used as a sintering inducing agent may include free-radical polymerizable compounds which may be selected among polymerizable reactive functional groups, such as, for example, a (meth)acrylic and a meth (acryl)amide functional group.

The term "(meth)acrylic" or "(meth)acrylate" and diversions thereof refer to both acrylic and methacrylic compounds.

Free-radical polymerizable compounds may include (meth)acrylic or meth(acryl)amide monomers, (meth)acrylic or (meth)acrylamide oligomers, meth)acrylic or (meth)acrylamide polymers and any combination thereof. Exemplary such compounds are described hereinabove.

Substances that can be used as a sintering inducing agent may include cationic polymerizable monomers, for example based on epoxide compounds, oxetane, vinyl ether and/or oligomers, the monomers bearing a cationic moiety can be, for example, quarternary ammonium salt. A non-limiting example of epoxy compounds includes glycidyl trimethylammonium chloride.

Substances that can be used as a sintering inducing agent may alternatively or additionally include isocyanate compounds, optionally and preferably with quaternary ammonium groups for polyurethane chemistry, and/or caprolactam based compounds, optionally and preferably with quaternary ammonium groups for anionic polymerization.

Additional examples of cationic groups include, without limitation, poly(diallyldimethylammonium chloride), cationically charged polyimides, polyethyleneimine and polypyrroles.

In some of any of the embodiments described herein, the sintering inducing agent forms a sintering inducing composition. In some of these embodiments, for example, when the sintering inducing agent is an acrylic compound bearing quaternary ammonium groups, such as described herein, such a composition may exhibit high viscosity, which may limit its use in 3D-inkjet printing processes. Such acrylic compounds may further exhibit relatively low reactivity which may affect their 3D building capabilities.

In order to improve the performance of such sintering inducing compositions, "non active" materials, which are inert toward sintering, can be added to the sintering inducing composition. Such materials are also referred to herein as sintering inert materials. In some embodiments, the sintering inert material is a curable material. In some embodiments, the sintering inert material is a UV curable material. Alternatively, the sintering inert material is a free-radical polymerizable material or is polymerizable via cationic polymerization.

In some embodiments, the amount of the sintering inert material in the sintering inducing composition is at least 20%, at least 30%, at least 40%, at least 45%, at least 50%, at least 55%, or at least 60%, by weight, of the total weight of the composition.

In some embodiments, the sintering inert material is hydrophilic and is preferably compatible with the polymerizable ionic group in the salt (e.g., with quaternary ammonium acrylic compounds).

Non limiting examples of sintering inert materials include monofunctional or multifunctional (e.g., difunctional, trifunctional, etc.) acrylates or methacrylates, such as acryloyl morpholine (ACMO), hydroxyethyl acrylate (BASF), hydroxyethyl acrylamide (Rahn) (HEAA), polyethylene glycol diacrylate (Sartomer, SR344), ethoxylated trimethylol propane acrylate (Sartomer, SR415), hydroxyethylacylate, bispenol A ethoxylated dimethacrylate (Sartomer, SR9036) and the like.

Additional non-limiting examples of sintering inert materials include monofunctional or multifunctional (e.g., difunctional, trifunctional, etc.) vinyl ethers, such as hydroxybutyl vinyl ether (HBVE), ethyl vinyl ether, butanediol vinyl ether, diethyleneglycol divinyl ether, triethyleneglycol divinyl ether, and the like.

In some of any of the embodiments described herein, when a sintering inducing composition comprises a curable material (e.g., a curable sintering inducing agent and/or a sintering inert curable material), the composition further comprises an initiator, for initiating the polymerization.

In some embodiments, the initiator is for initiating free-radical polymerization, and in some embodiments, it is a photoiniator, activatable by UV irradiation.

In some embodiments, the radical photoinitiators is suitable for UV activation using medium pressure mercury lamp.

The photoinitiator may be a single compound or a combination of two or more compounds, which form an initiating system. A non-limiting example of a suitable UV free radical initiator is 1-[4-(2-Hydroxyethoxy)-phenyl]-2-hydroxy-2-methyl-1-propane-1-one which is available under the trade name IGRACURE I-2959 from Ciba Specialty Chemicals (Switzerland). Other alpha-hydroxy ketones including Darocure 1173, Irgacure 184 from Ciba and acyl phosphines including Darocur TPO can be also used.

When the sintering inducing agent is non UV reactive, in may be selected from the group consisting of a salt, such as, but not limited to, KCl, NaCl, $MgCl_2$, $AlCl_3$, LiCl, $CaCl_2$, organic or inorganic acids, e.g., HCl, $H_2SO_4$, $HNO_3$, $H_3PO_4$, and organic or inorganic bases, e.g., ammonia, organic amines (e.g., aminomethyl propanol (AMP)), NaOH and KOH).

In some embodiments, the sintering is at a room temperature (e.g., about 25° C.), and in some embodiments of the present invention the sintering is at the operation temperature of the AM system, e.g., from about 40° C. to about 50° C. Higher temperatures are also contemplated.

Figure 2:
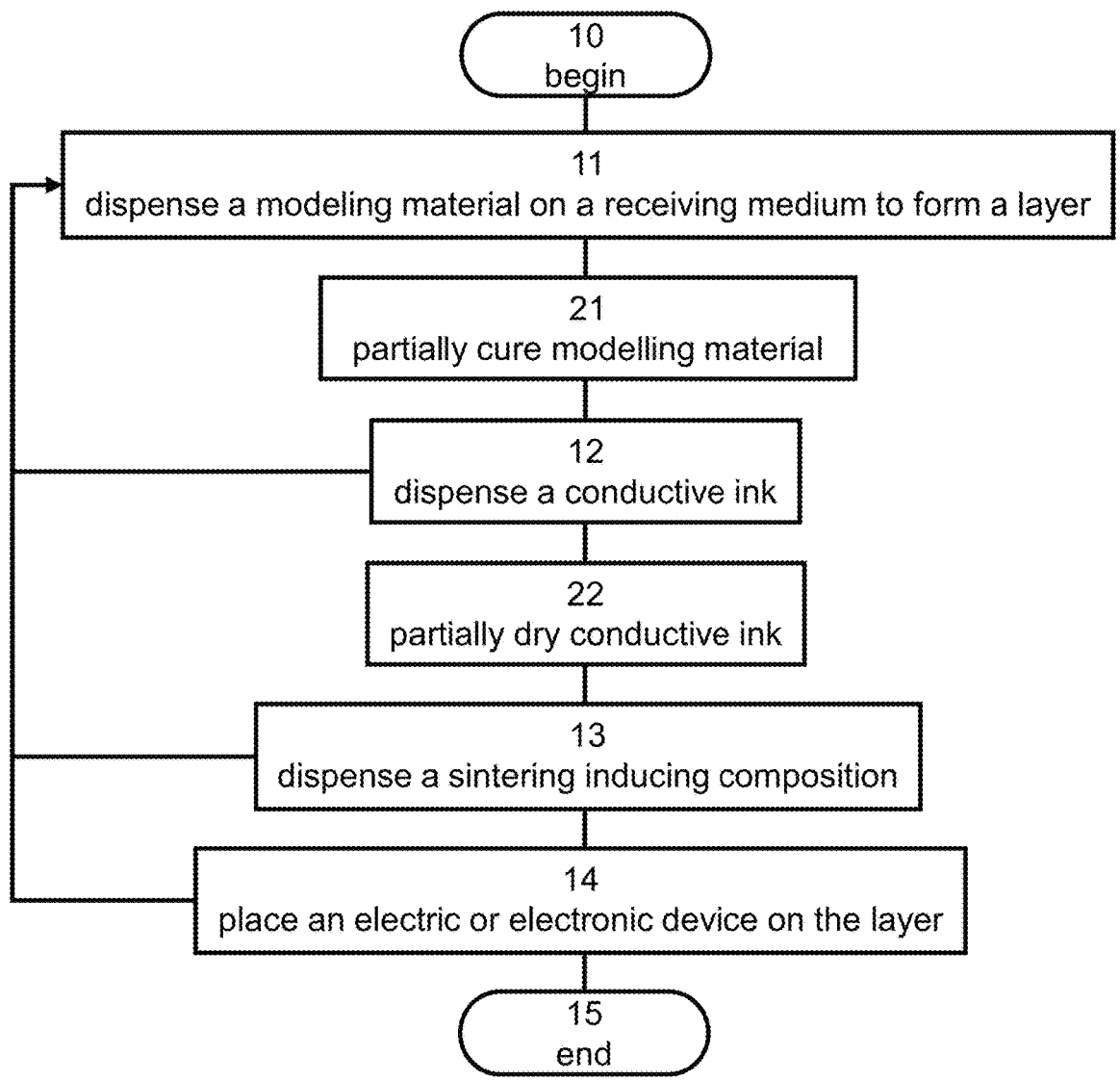
FIG. 2 is a flowchart diagram of a method of manufacturing a conductive element according to various exemplary embodiments of the present invention.

FIG. 2 is a flowchart diagram of a method of manufacturing a conductive element according to various exemplary embodiments of the present invention. The method can be executed by an additive manufacturing system, e.g., system 110. Preferably, the method is executed by a 3D inkjet printing system.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 10 and continues to 11 at which a modeling material is dispensed on a receiving medium to form a layer. The receiving medium can be the tray of the AM system, a substrate placed on the tray, or a layer dispensed previously by one or more of the dispensing heads of the AM system. At 21, the modelling material is optionally partially cured. At 12, a conductive ink is dispensed on the layer to form a conductive element. The conductive element can have any shape, including, without limitation, linear shape (e.g., a straight or curved line), or any other planar shape. In some embodiments of the invention the modeling material preferably comprises mixed with a sintering inducing agent as further detailed hereinabove. At 22, the conductive ink is optionally partially dried. Alternatively or additionally, a composition comprising sintering inducing agent can be dispensed on the layer and/or the conductive element as shown at 13. The composition can be dispensed directly on the conductive element (optionally also on regions of the layer nearby the conductive element), in which case 13 is executed after 12. Alternatively or additionally, 13 can be executed before 12 in which case the conductive ink is dispensed on the region of the layer that contain the dispensed composition.

In some embodiments of the present invention the method loops back to 11 to form an additional layer of modeling material. The additional layer can be dispensed on the conductive element. When the modeling material is mixed with the sintering inducing agent, the additional layer further facilitates the sintering since the conductive ink can react with the sintering inducing agent above the conductive element.

In some embodiments of the present invention the method proceeds to 14 at which an electronic or electric device is placed on one of the formed layers, such that an electric terminal of the device contacts the conductive element. The device may be of any type, including, without limitation, a microchip, a battery, a PCB, a light emitting device (e.g., a light emitting diode or a lamp), a radiofrequency identification (RFID) tag, a transistor, and the like. When the device includes two or more terminals that engage the same plane, two or more respective conductive elements are optionally and preferably dispensed on the layer prior to the placement of the device thereon, wherein the conductive elements are dispensed at locations on the layer that allow the electric terminals of the device to establish electrical communication with the conductive elements once the device is in place.

The method ends at 15.

A method according to an embodiment of the invention in which the modeling material is mixed with a sintering inducing agent, can be summarized as follows: a modeling material which comprises a sintering inducing agent is dispensed on a receiving medium to form a layer, and a conductive ink is dispensed on the layer of modeling material to form a conductive element.

A method according to an embodiment of the invention in which a composition comprising sintering inducing agent is dispensed on the conductive element or the modeling material can be summarized as follows: a modeling material is dispensed on a receiving medium to form a layer, a conductive ink is dispensed on the layer of modeling material to form a conductive element, and a sintering inducing composition having a sintering inducing agent is dispensed on at least one of the layer and the conductive element.

A method according to an embodiment of the invention in which a conductive ink is dispensed on a composition comprising sintering inducing agent can be summarized as follows: a modeling material is dispensed on a receiving medium to form a layer, a sintering inducing composition having a sintering inducing agent is dispensed on the layer, and a conductive ink is dispensed on the dispensed sintering inducing composition to form a conductive element. Optimally, another layer of sintering inducing composition is dispensed on at least one of the layer and the conductive element. For example, the additional layer of sintering inducing composition can be dispensed such that the conductive element is sandwiched between two layers of sintering inducing composition.

In any of the embodiments of the present invention, selective operations of the method are optionally and preferably repeated to provide a layered object having any number of layers, any number of conductive elements and any number of electrical or electronic devices.

Figure 3:
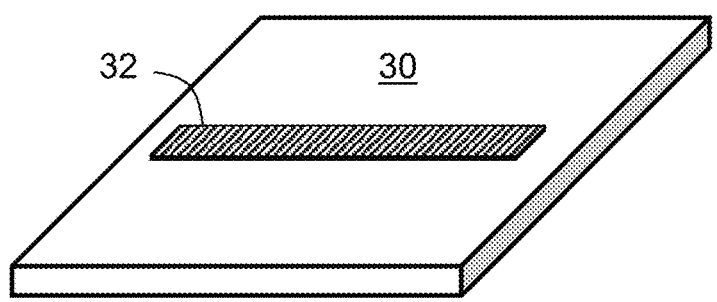
FIG. 3 is a schematic illustration of a layer made of a modeling material carrying a conductive element made of conductive ink, according to some embodiments of the present invention.
Figure 4:
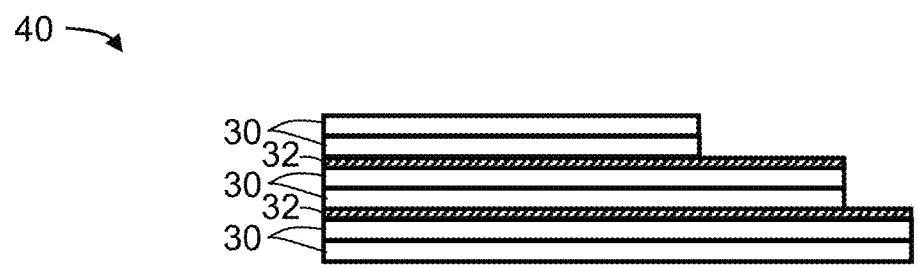
FIG. 4 is a schematic illustration of an object formed of a plurality of layers of modeling material, and a plurality of conductive elements embedded therein according to some embodiments of the present invention.
Figure 5:
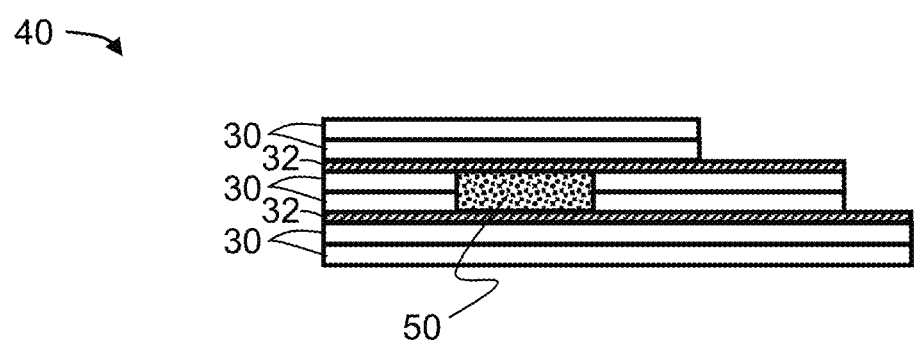
FIG. 5 is a schematic illustration of an object formed of a plurality of layers of modeling material, a plurality of conductive elements, and an electric or electronic device according to some embodiments of the present invention.

A representative example of a layer 30 made of a modeling material and a conductive element 32 made of conductive ink, is schematically illustrated in FIG. 3. A representative example of an object 40 formed of a plurality of layers 30 of modeling material, and a plurality of conductive elements 32 embedded therein is schematically illustrated in FIG. 4. A representative example of object 40 in embodiments in which object 40 also comprises an electric or electronic device 50 is schematically illustrated in FIG. 5. In the schematic illustration of FIG. 5, device 50 is connected to one conductive element above the device and another conductive element above below the device. However, this need not necessarily be the case, since, for some applications, other configuration are contemplated. For example, in some embodiments device 50 can be connected to two separate conductive elements that are below device 50, and in some embodiments device 50 can be connected to two separate conductive elements that are above device 50. Also contemplated are embodiments in which device 50 is connected to more than two conductive elements. These embodiments are particularly useful when device 50 has three or more terminals. A representative example is a transistor in which case one conductive element is used to connect device 50 to a source electrode, one conductive element is used to connect device to a drain electrode, and one pattern is used to connect device conductive element to a gate electrode. Another example is a multi-terminal microchip in which three or more terminals of the microchip are connected to different conductive elements.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

Herein throughout, the term "hydrocarbon" collectively describes a chemical group composed mainly of carbon and hydrogen atoms. A hydrocarbon can be comprised of alkyl, alkene, alkyne, aryl, and/or cycloalkyl, each can be substituted or unsubstituted, and can be interrupted by one or more heteroatoms. The number of carbon atoms can range from 2 to 20, and is preferably lower, e.g., from 1 to 10, or from 1 to 6, or from 1 to 4.

As used herein, the term "amine" describes both a —NR'R" group and a —NR'— group, wherein R' and R" are each independently hydrogen, alkyl, cycloalkyl, aryl, as these terms are defined hereinbelow.

The amine group can therefore be a primary amine, where both R' and R" are hydrogen, a secondary amine, where R' is hydrogen and R" is alkyl, cycloalkyl or aryl, or a tertiary amine, where each of R' and R" is independently alkyl, cycloalkyl or aryl.

Alternatively, R' and R" can each independently be hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, guanyl, guanidine and hydrazine.

An "ammonium" group as used herein described a +N—R'R"R'", with R' and R" as described herein and R'" as described for R' and R". When R', R" and R'" are each independently alkyl, cycloalkyl or aryl (or a hydrocarbon as described herein, the ammonium is a quaternary ammonium.

The term "alkyl" describes a saturated aliphatic hydrocarbon including straight chain and branched chain groups. Preferably, the alkyl group has 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. More preferably, the alkyl is a medium size alkyl having 1 to 10 carbon atoms. Most preferably, unless otherwise indicated, the alkyl is a lower alkyl having 1 to 4 carbon atoms (C(1-4) alkyl). The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Herein, a C(1-4) alkyl, substituted by a hydrophilic group, as defined herein, is included under the phrase "hydrophilic group" herein.

Alkene and Alkyne, as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

Cycloalkyls of 1-6 carbon atoms, substituted by two or more hydrophilic groups, as defined herein, is included under the phrase "hydrophilic group" herein.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholino, oxalidine, and the like. The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

A heteroalicyclic group which includes one or more of electron-donating atoms such as nitrogen and oxygen, and in which a numeral ratio of carbon atoms to heteroatoms is 5:1 or lower, is included under the phrase "hydrophilic group" herein.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, oxazole, indole, purine and the like.

The term "halogen" and "halo" describes fluorine, chlorine, bromine or iodine.

The term "halide" or "halogen ion" describes an anion of fluorine, chlorine, bromine or iodine.

The term "haloalkyl" describes an alkyl group as defined above, further substituted by one or more halide.

The term "sulfate" describes a —O—S(=O)$_2$—OR' end group, as this term is defined hereinabove, or an —O—S(=O)$_2$—O— linking group, as these phrases are defined hereinabove, where R' is as defined hereinabove.

The term "thiosulfate" describes a —O—S(=S)(=O)—OR' end group or a —O—S(=S)(=O)—O— linking group, as these phrases are defined hereinabove, where R' is as defined hereinabove.

The term "carbonyl" or "carbonate" as used herein, describes a —C(=O)—R' end group or a —C(=O)— linking group, as these phrases are defined hereinabove, with R' as defined herein.

The term "thiocarbonyl" as used herein, describes a —C(=S)—R' end group or a —C(=S)— linking group, as these phrases are defined hereinabove, with R' as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group.

The term "cyano" describes a —C≡N group.

The term "isocyanate" describes an —N=C=O group.

The term "isothiocyanate" describes an —N=C=S group.

The term "nitro" describes an —NO₂ group.

The term "acyl halide" describes a —(C=O)R"" group wherein R"" is halide, as defined hereinabove.

The term "carboxylate" as used herein encompasses C-carboxylate and O-carboxylate.

The term "C-carboxylate" describes a —C(=O)—OR' end group or a —C(=O)—O— linking group, as these phrases are defined hereinabove, where R' is as defined herein.

The term "O-carboxylate" describes a —OC(=O)R' end group or a —OC(=O)— linking group, as these phrases are defined hereinabove, where R' is as defined herein.

The term "thiocarboxylate" as used herein encompasses C-thiocarboxylate and O-thiocarboxylate.

The term "C-thiocarboxylate" describes a —C(=S)—OR' end group or a —C(=S)—O— linking group, as these phrases are defined hereinabove, where R' is as defined herein.

The term "O-thiocarboxylate" describes a —OC(=S)R' end group or a —OC(=S)— linking group, as these phrases are defined hereinabove, where R' is as defined herein.

The term "carbamate" as used herein encompasses N-carbamate and O-carbamate.

The term "N-carbamate" describes an R"OC(=O)—NR'— end group or a —OC(=O)—NR'— linking group, as these phrases are defined hereinabove, with R' and R" as defined herein.

The term "O-carbamate" describes an —OC(=O)—NR'R" end group or an —OC(=O)—NR'— linking group, as these phrases are defined hereinabove, with R' and R" as defined herein.

The term "thiocarbamate" as used herein encompasses N-thiocarbamate and O-thiocarbamate.

The term "O-thiocarbamate" describes a —OC(=S)—NR'R" end group or a —OC(=S)—NR'— linking group, as these phrases are defined hereinabove, with R' and R" as defined herein.

The term "N-thiocarbamate" describes an R"OC(=S)NR'— end group or a —OC(=S)NR'— linking group, as these phrases are defined hereinabove, with R' and R" as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)—NR'R" end group or a —SC(=S)NR'— linking group, as these phrases are defined hereinabove, with R' and R" as defined herein.

The term "N-dithiocarbamate" describes an R"SC(=S)NR'— end group or a —SC(=S)NR'— linking group, as these phrases are defined hereinabove, with R' and R" as defined herein.

The term "amide" as used herein encompasses C-amide and N-amide.

The term "C-amide" describes a —C(=O)—NR'R" end group or a —C(=O)—NR'— linking group, as these phrases are defined hereinabove, where R' and R" are as defined herein.

The term "N-amide" describes a R'C(=O)—NR"— end group or a R'C(=O)—N— linking group, as these phrases are defined hereinabove, where R' and R" are as defined herein.

The term "hydrazine" describes a —NR'—NR"R"' end group or a —NR'—NR"— linking group, as these phrases are defined hereinabove, with R', R", and R'" as defined herein.

As used herein, the term "hydrazide" describes a —C(=O)—NR'—NR"R'" end group or a —C(=O)—NR'—NR"— linking group, as these phrases are defined hereinabove, where R', R" and R'" are as defined herein.

As used herein, the term "thiohydrazide" describes a —C(=S)—NR'—NR"R'" end group or a —C(=S)—NR'—NR"— linking group, as these phrases are defined hereinabove, where R', R" and R'" are as defined herein.

As used herein, the term "alkylene glycol" describes a —O—[(CR'R")$_z$—O]$_y$—R'" end group or a —O—[(CR'R")$_z$—O]$_y$— linking group, with R', R" and R'" being as defined herein, and with z being an integer of from 1 to 10, preferably, 2-6, more preferably 2 or 3, and y being an integer of 1 or more. Preferably R' and R" are both hydrogen. When z is 2 and y is 1, this group is ethylene glycol. When z is 3 and y is 1, this group is propylene glycol.

When y is greater than 4, the alkylene glycol is referred to herein as poly(alkylene glycol). In some embodiments of the present invention, a poly(alkylene glycol) group or moiety can have from 10 to 200 repeating alkylene glycol units, such that z is 10 to 200, preferably 10-100, more preferably 10-50.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Experiments were performed in accordance with some embodiments of the present invention. Using an AM system, objects containing trenches were prepared from a modeling material. The dimensions of the trenches were 10 mm in width, 40 mm in length, and 2 mm in depths.

The conductive ink included Ag particles therein, and is identified as S. Magdassi ink, batch No. IC-3-9-14-2.

Two sintering inducing agents were tested in the experiments. Both agents were polymerized acrylic monomers bearing quaternary ammonium groups. A first agent included Visiomer TMAEMC and a second agent included Adamquat MC 80. To these monomers 3% w/w of TPO photoinitiator was added (0.45 gr TPO to 15 gr monomer) followed by heating at 40° C. for 15 minutes and vigorous mixing.

Surface resistance measurements were made using 2 W fluke multimeter.

Experiment 1:

About 0.7 gr of acrylic sintering inducing agent including photoinitiator was applied to the trenches followed by curing using the UV medium pressure mercury lamp. A sample in one trench (denoted trench 1) was exposed for 8 cycles to achieve semi polymerized surface, and a sample in another trench (denoted trench 2) was exposed for 6 cycles. An additional trench was used as control, and was not applied with sintering inducing agent.

Figure 6A:
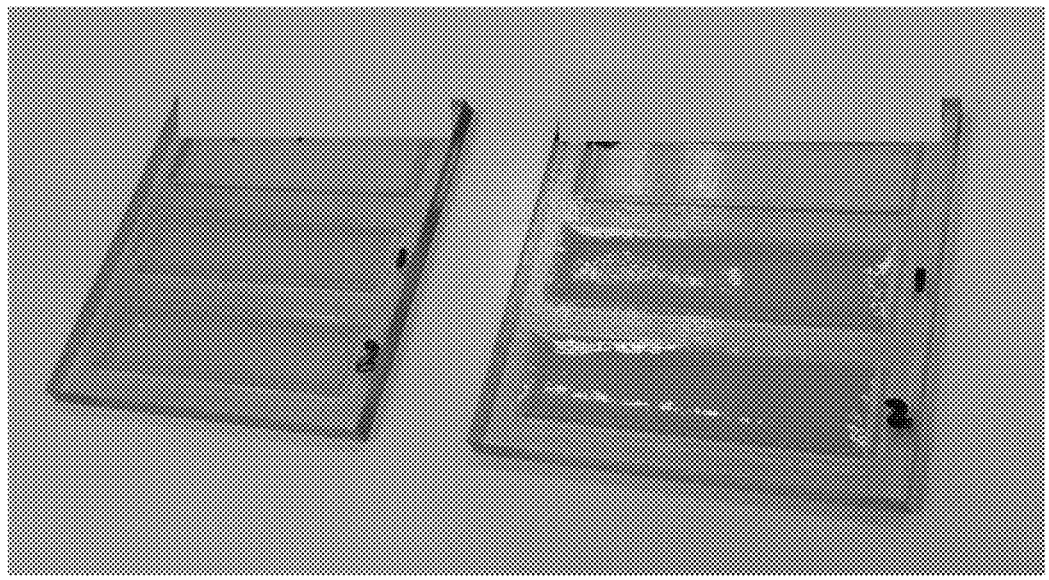
FIGS. 6A, 6B, 6C, 6D and 6E are images captured during experiments performed according to some embodiments of the present invention.

An image of the applied trenches is shown in FIG. 6A, where trenches applied with Adamquat MC 80 are shown on the left side of the image and trenches applied with Visiomer TMAEMC are shown on the right side of the image. The trenches are marked with numerals "1" and "2" representing trench 1 and trench 2, respectively. The unmarked trenches are control, to which no acrylic material was applied.

The results of the resistance measurements in this experiment are summarized in Table 1, below.

TABLE 1

|  | Visiomer TMAEMC | Adamquat MC 80 |
|---|---|---|
| Trench 1 | 0.13 MΩ | 0.20 MΩ |
| Trench 2 | 0.10 MΩ | 0.17 MΩ |

Experiment 2:

About 0.1 gr of ink was applied trenches 1 and 2 and to the control trench of Experiment 1. Thus, in trenches 1 and 2 conductive ink was applied over the acrylic sintering inducing agent, and in the control trench which had no acrylic material.

Figure 6B:
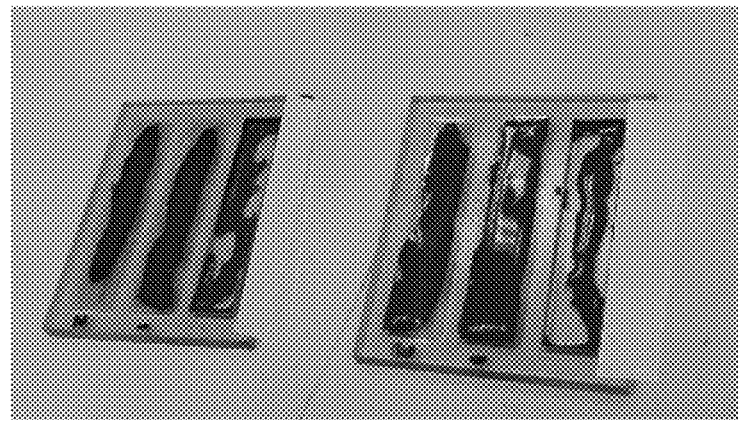

An image of the trenches immediately following the application of ink thereto is shown in FIG. 6B. Notations are the same as in FIG. 6A, namely trenches with Adamquat MC 80 are on the left side, trenches with Visiomer TMAEMC are on the right side, the marks "1" and "2" represent trench 1 and trench 2, respectively, and the unmarked trenches are control.

Figure 6C:
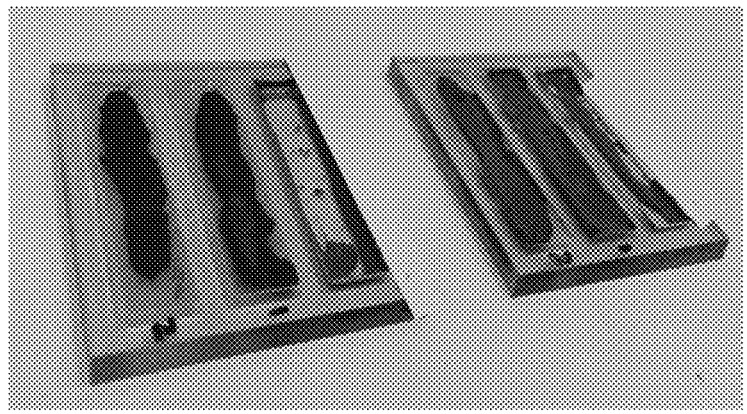

After 30 minutes at room temperature, the silver color at trenches 1 and 2 changed its color. No color change was observed in the control trench. This is shown in the image of FIG. 6C (notations are the same as in FIG. 6A).

Figure 6D:
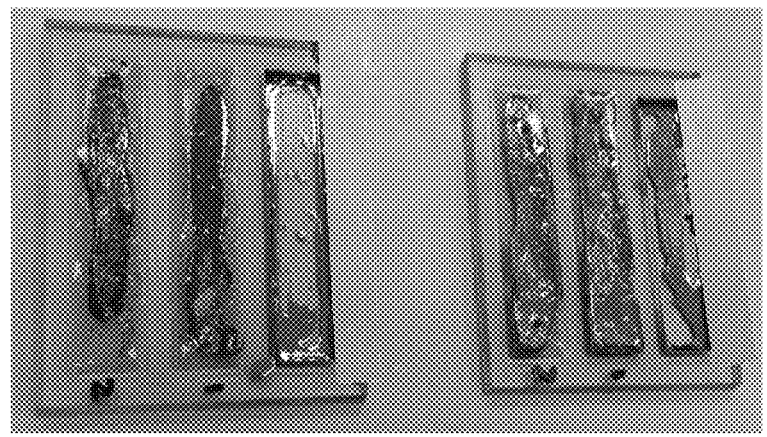

The samples were then kept at a temperature of 40° C. for 1 hr in order to evaporate the solvent (FIG. 6D, notations are the same as in FIG. 6A).

Figure 6E:
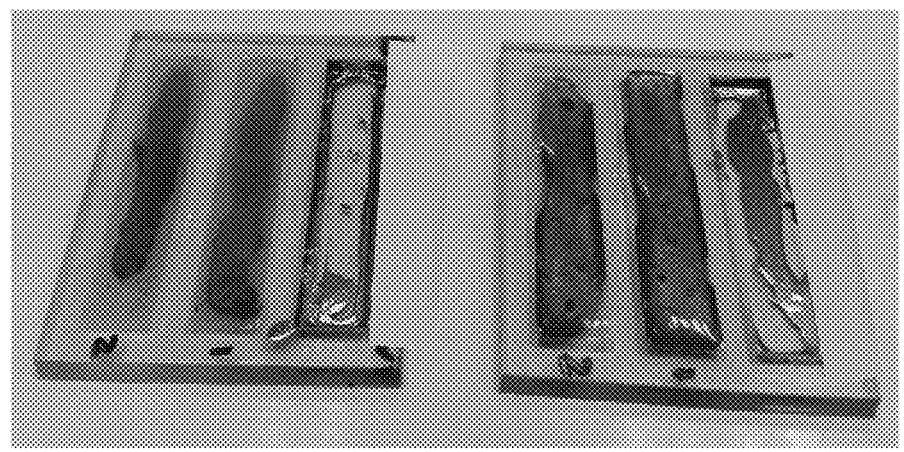

Experiment 3:

Trenches 1 and 2 of experiment 2 were then re-applied with about 0.7 gr of acrylic sintering inducing agent including photoinitiator. No mixing of the acrylate with the conductive ink was evident since conductive ink was dried before applying the acrylic material. Curing was applied using UV medium pressure mercury lamp. Trench 1 was exposed for 8 cycles to get semi polymerized surface, and trench 2 was exposed for 6 cycles (FIG. 6E, notations are the same as in FIG. 6A).

The resistance of the surface was measured as previously described. The applied pattern was intersected to allow direct contact with the conductive ink for conductivity measurement.

The results of the resistance measurements are summarized in Table 2, below, where row A corresponds to the resistance of the conductive ink without re-application with acrylic sintering inducing agent, and row B corresponds to the resistance with re-application with acrylic sintering inducing agent.

TABLE 2

|  | Visiomer TMAEMC | Adamquat MC 80 | Control |
|---|---|---|---|
| A | 18-22 kΩ | 13-14 kΩ | 3.5 MΩ |
| B | 1-20 Ω | 1-20 Ω | 3.5 MΩ |

Table 2 demonstrates that modeling material containing quaternary ammonium groups to according to some embodiments of the present invention with sintering inducing agent successfully improves the conductivity of the ink. Use of sintering inducing agent below the ink increase the conductivity by about 3 orders of magnitudes compared to the control, and use of sintering inducing agent both below and above the ink increase the conductivity by about 6 orders of magnitudes compared to the control.

Experiment 4:

Table 3 below presents exemplary sintering inducing compositions containing sintering inert materials, according to some embodiments of the present invention, suitable for use in situ sintering of deposited conductive paths.

TABLE 3

|  | Formulation No. | | | |
|---|---|---|---|---|
| Component | #1 | #2 | #3 | #4 |
| ACMO | 25 | | | |
| HBVE | 12 | | | |
| DMAPAAQ | 63 | 63 | 63 | 69 |
| HEAA | | 12 | 12 | |
| SR 415 | | 25 | | 15.5 |
| SR344 | | | 25 | |
| SR 9036 | | | | 15.5 |

The results of the resistance measurements are summarized in Table 4 below. Row A of Table 4 corresponds to the resistance of a conductive ink in an experiment in which the conductive ink was deposited on sintering inducing composition having a sintering inducing agent. Row B of Table 4 corresponds to the resistance of the conductive ink in an experiment in which the conductive ink was sandwiched between two layers of sintering inducing composition (the conductive ink was deposited on the sintering inducing composition, and then a layer of sintering inducing composition was deposited on the deposited conductive ink). The rightmost column of Table 4 provides the resistance of a control experiment in which the conductive ink was deposited without using sintering inducing composition. As shown, the sintering inducing composition of the present embodiments provides an unexpected effect of conductivity that is improved several orders of magnitude.

TABLE 4

|  | #1 | #2 | Control |
|---|---|---|---|
| A | 10-50 kΩ | 10-50 kΩ | 2-5 MΩ |
| B | 1-100 Ω | 1-100 Ω | 2-5 MΩ |

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of manufacturing a conductive element, the method being executed by an additive manufacturing system and comprising:
dispensing on a receiving medium a curable modeling material containing a sintering inducing agent to form a layer; and
dispensing a conductive ink on said layer of modeling material to form a conductive element,
wherein said curable modeling material is formulated for use in additive manufacturing and is able to form a three-dimensional object on its own,
and wherein said sintering inducing agent is represented by the general formula:

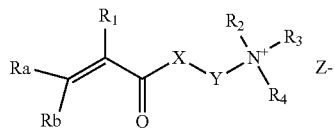

wherein:
X is O or NH;
Y is a substituted or unsubstituted hydrocarbon chain from 1 to 20 carbon atoms in length;
$R_1$ is H, alkyl or cycloalkyl;
Ra and Rb are each independently H, alkyl or cycloalkyl,
$R_2$-$R_4$ are each independently an alkyl; and
Z is an anion.

2. The method of claim 1, wherein said conductive ink is non-curable.

3. The method of claim 1, wherein said conductive ink is curable.

4. The method according to claim 1, further comprising partially curing said modeling material prior to said dispensing of said conductive ink.

5. The method according to claim 1, further comprising at least partially drying said conductive ink following said dispensing of said conductive ink, wherein said at least partially drying comprises evaporation of at least 10% of solvent in said conductive ink.

6. The method according to claim 1, further comprising dispensing a curable modeling material to form a layer on a surface of said conductive element, wherein said curable modeling material dispensed on said surface of said conductive element also comprises said sintering inducing agent.

7. The method according to claim 1, wherein said sintering inducing composition is dispensed at least on said conductive element.

8. The method according to claim 1, wherein said counter anion is chloride.

9. A method of manufacturing a conductive element, the method being executed by an additive manufacturing system and comprising:
dispensing on a receiving medium a curable modeling material containing a sintering inducing agent to form a layer, said curable modeling material being formulated for use in additive manufacturing and being able to form a three-dimensional object on its own;
dispensing a conductive ink on said layer of modeling material to form a conductive element; and
dispensing a sintering inducing composition having a sintering inducing agent on at least one of said layer and said conductive element, wherein said sintering inducing agent is represented by the general formula:

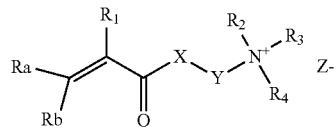

wherein:
X is O or NH;
Y is a substituted or unsubstituted hydrocarbon chain from 1 to 20 carbon atoms in length;
$R_1$ is H, alkyl or cycloalkyl;
Ra and Rb are each independently H, alkyl or cycloalkyl,
$R_2$-$R_4$ are each independently an alkyl; and
Z is an anion.

10. The method of claim 9, wherein said conductive ink is curable.

11. The method of claim 9, wherein said conductive ink is non-curable.

12. The method according to claim 9, wherein said sintering inducing composition further comprises a sintering inert material selected from the group consisting of an acrylate, a methacrylate, an acrylamide, a methacrylamide, and a vinyl ether, each being monofunctional or multifunctional, wherein said sintering inert material does not comprise an ionic group, and an amount of said sintering inert material in said sintering inducing composition is at least 20% by weight.

* * * * *